United States Patent
Gurich et al.

(10) Patent No.: US 6,320,297 B1
(45) Date of Patent: *Nov. 20, 2001

(54) METHOD FOR LOW LOSS CONTROL OF A CAPACITIVE LOAD, IN PARTICULAR OF A PIEZOELECTRIC ACTUATOR

(75) Inventors: Gunter Gurich; Thomas Flecke; Martin Dusterhoft, all of Aachen (DE)

(73) Assignee: FEV Motorentechnik GmbH & Co. Kommanitgesellschaft, Aachen (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/319,465
(22) PCT Filed: Sep. 24, 1998
(86) PCT No.: PCT/EP98/06093
 § 371 Date: Sep. 16, 1999
 § 102(e) Date: Sep. 16, 1999
(87) PCT Pub. No.: WO99/18618
 PCT Pub. Date: Apr. 15, 1999

(30) Foreign Application Priority Data

Oct. 7, 1997 (DE) .............................................. 197 44 236

(51) Int. Cl.[7] ..................................................... H01L 41/04
(52) U.S. Cl. ....................................... 310/316.03; 310/317
(58) Field of Search ............................... 310/316.03, 317

(56) References Cited

U.S. PATENT DOCUMENTS

| | | | | |
|---|---|---|---|---|
| 4,109,174 | * | 8/1978 | Hodgson | 310/316 |
| 5,204,576 | * | 4/1993 | Mitsuyasu | 310/317 |
| 5,208,505 | * | 5/1993 | Mitsuyasu | 310/317 |
| 5,543,679 | * | 8/1996 | Morino et al. | 310/316 |
| 5,691,592 | * | 11/1997 | Gunderson et al. | 310/317 |
| 6,081,061 | * | 6/2000 | Reineke et al. | 310/316.03 |

FOREIGN PATENT DOCUMENTS

| | | |
|---|---|---|
| 44 35 832 A1 | 4/1996 | (DE) . |
| 0 871 230 A1 | 10/1998 | (EP) . |

OTHER PUBLICATIONS

Patent Abstracts of Japan, vol. 016, No. 282 (M–1269), Jun. 23, 1992 (JP 04071859).

* cited by examiner

*Primary Examiner*—Thomas M. Dougherty
(74) *Attorney, Agent, or Firm*—Venable; Robert Kinberg; Catherine M. Voorhees

(57) ABSTRACT

The invention related to a method for low loss periodic control of a capacitive load ($C_P$), in particular of a piezoelectric actuator. In this method, before load control begins, a capacitor bank ($C_1$) is charged via a voltage source ($U_B$) until the oprating voltage of load ($C_P$) is attained; then the load ($C_P$) is charged from the capacitor bank ($C_1$) via a series resonant circuit formed by a reactance coil ($L_1$), a freewheeling diode ($D_E$), and by the load ($C_P$). In this method, when a load is required, the load ($C_P$) is linked via discharge switch ($S_E$) to the reactance soil ($L_1$) which is itself connected via a freewheeling freewheeling diode ($D_L$) to the capacitor bank ($C_1$) in such a way that the load ($C_P$) is discharged until a residual voltage ($U_R$).

11 Claims, 3 Drawing Sheets

METHOD FOR LOW LOSS CONTROL OF A CAPACITIVE LOAD, IN PARTICULAR OF A PIEZOELECTRIC ACTUATOR

BACKGROUND OF THE INVENTION

The invention relates to a method for low loss control of a capacitive load $C_P$, particularly a piezoelectric actuator.

With respect to electrical control, piezoelectric actuators behave in the same way as capacitors, which are charged either from a current source or a voltage source. Piezoelectric actuators are normally actuated via a so-called RC control. With this method, the piezoelectric actuator is charged from a voltage source, e.g. a large capacitor, by way of a switch and an ohmic resistance. The switch is opened for the discharging and a second switch is closed, subsequently short-circuiting the piezoelectric actuator via another ohmic resistance. The charging curve and thus also the elongation curve of the piezoelectric actuator can be selected freely owing to the choice of resistances. The great disadvantage of the RC control is the high power consumption of large actuators, meaning for a correspondingly high capacitance and high operating frequencies. In the process, the energy $W=CU$ is converted in the resistances and the actuator into dissipation heat during each charging cycle and discharging cycle.

SUMMARY OF THE INVENTION

It is the object of the invention to develop a method for controlling piezoelectric actuators, which method for the most part reduces the electrical losses. That is, it is an object of the invention to develop a low-loss, and therefore energy-saving, circuit for activating piezoelectric actuators.

This object is solved according to the invention in that at the start of the load control, a capacitor bank is charged from a voltage source to the operating voltage of the capacitive load $C_P$, that the load $C_P$ is charged from the capacitor bank via a series resonant circuit formed by a reactance coil of a freewheeling diode and the load $C_P$. If a load is required in this case, the load $C_P$ is connected via a discharge switch to the reactance coil, which is connected via a freewheeling diode to the capacitor bank, so that the load $C_P$ can be discharged, except for a residual voltage. The advantage of this method is that when switching the load case, the residual load initially remains on the capacitive load $C_P$ and that subsequently this residual load can be conducted back to the capacitor bank, so that the residual load for the most part can be reclaimed.

According to one embodiment of the method according to the invention, it makes sense to briefly connect the reactance coil to a ground to reclaim the residual load from the capacitive load $C_P$, so that the residual load can be discharged to the capacitor bank. As a result of connecting the reactance coil briefly to ground, it is possible to regain the complete reactive power that was stored in the load.

Based on another embodiment of the method according to the invention, it is advantageous and particularly useful if the capacitor bank is much larger than the capacitive load $C_P$. In this way, a maximum voltage transformation ratio, e.g. with factor 2, can be achieved between the source voltage and the load voltage. Above all, this is the case if the capacitor bank capacitance is practically infinite in relation to the capacitance of load $C_P$.

Above all, the method according to the invention has the particular advantage that the full load operation voltage from the capacitor bank is available after the capacitor bank is charged to the operating voltage. Adjusting the voltage at the capacitor bank to a stable initial state permits a stable and reproducible charging of the capacitive load $C_P$. The voltage at the capacitor bank as well as the voltage at the load $C_P$ can be used as input variable for the adjustment.

BRIEF DESCRIPTION OF THE DRAWINGS

The invention is explained in further detail with the aid of switching diagrams and current and voltage diagrams, in which.

DETAILED DESCRIPTION OF THE INVENTION

Figure 1:
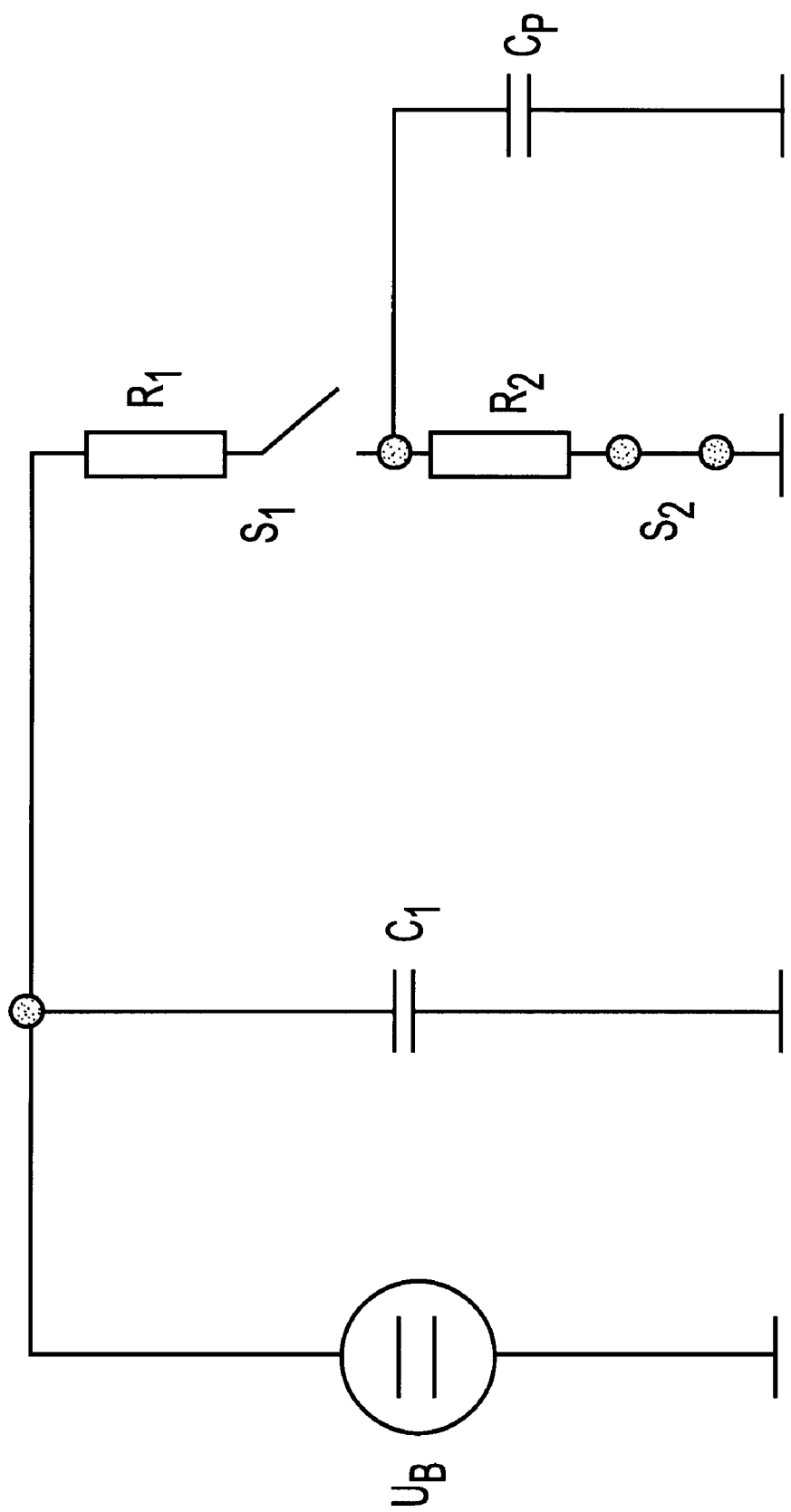
FIG. 1 is switching arrangement based on the state of the technology.

The switching arrangement shown in FIG. 1 for implementing the method according to the state of the technology contains a piezoelectric actuator $C_P$, which can be charged by way of a capacitor bank $C_1$. The capacitor bank $C_1$ is connected to a corresponding, equal current supply $U_B$, which serves to recharge the capacitor bank $C_1$. The actuator $C_P$ is charged by closing a switch $S_1$ via an ohmic resistance $R_1$. The switch $S_1$ is opened for the discharging and a second switch $S_2$ is closed, which then short circuits the actuator $C_P$ via a second ohmic resistance $R_2$. Owing to the section of the resistances $R_1$ and $R_2$, the charging curve and thus also the elongation curve of the actuator $C_P$ can be selected freely. The initial charging of the actuator $C_P$ thus occurs directly from the capacitor bank $C_1$. If the actuator $C_P$ is discharged, a considerable residual charge remains on the actuator $C_P$, which is destroyed with the aid of a short circuit.

Figure 2:
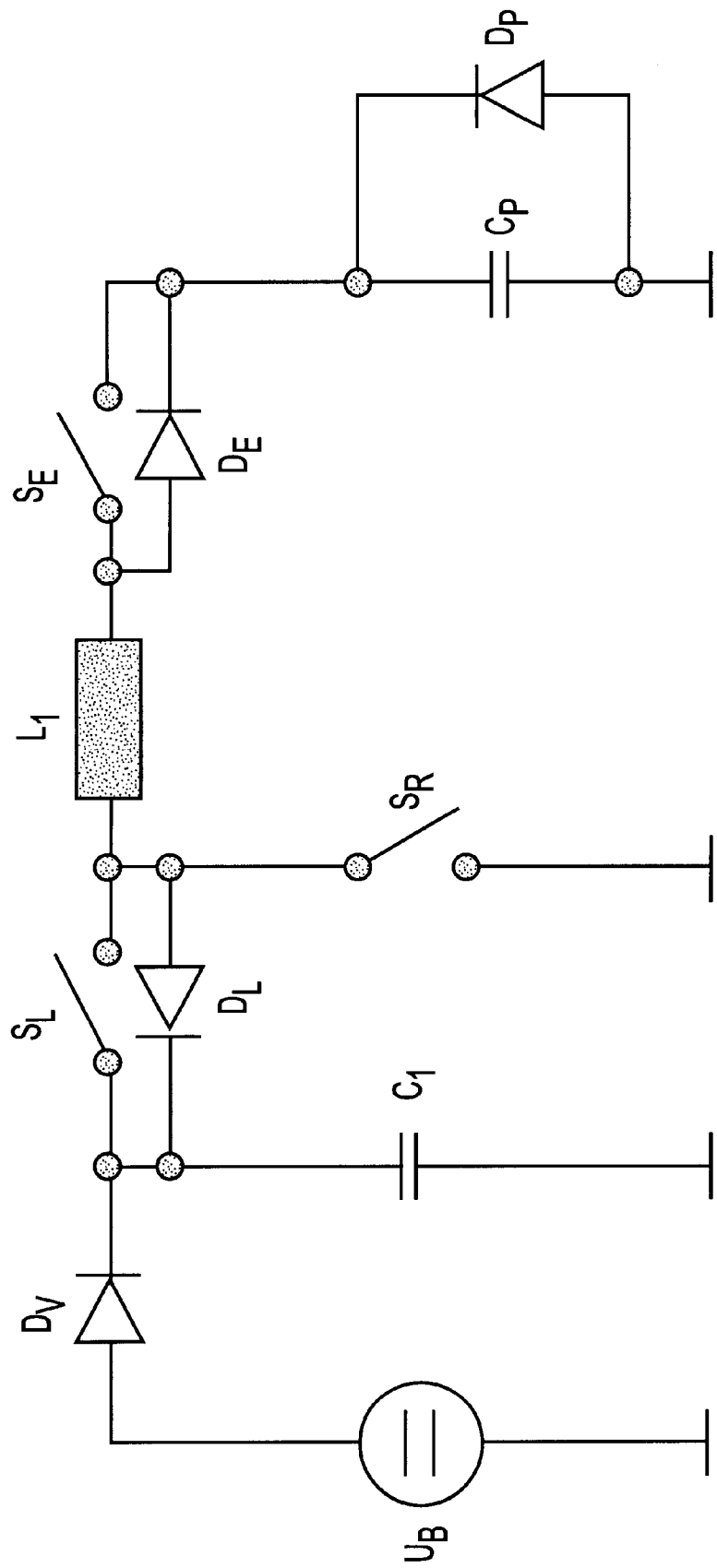
FIG. 2 is switching arrangement for implementing the method according to the invention.
Figure 3A:
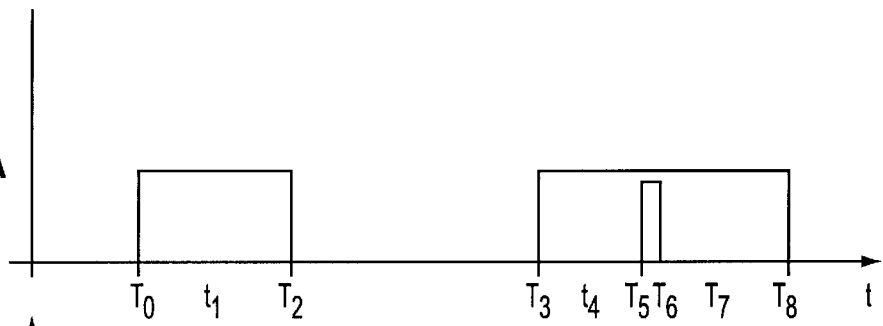
FIGS. 3a–d illustrate the time curves for control pulses voltage at the capacitor bank $C_1$, voltage at the load $C_P$, and load current, respectively.
Figure 3B:
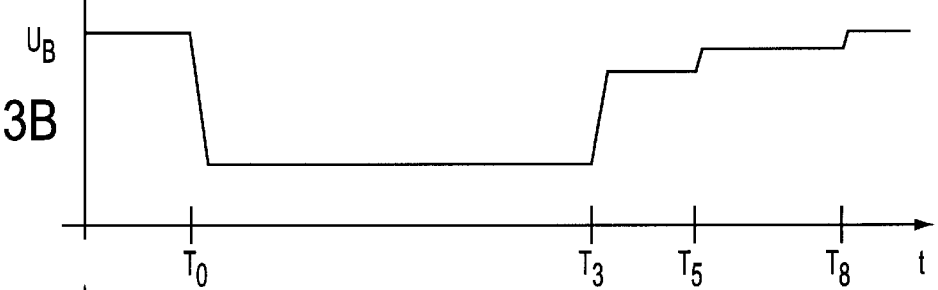
Figure 3C:
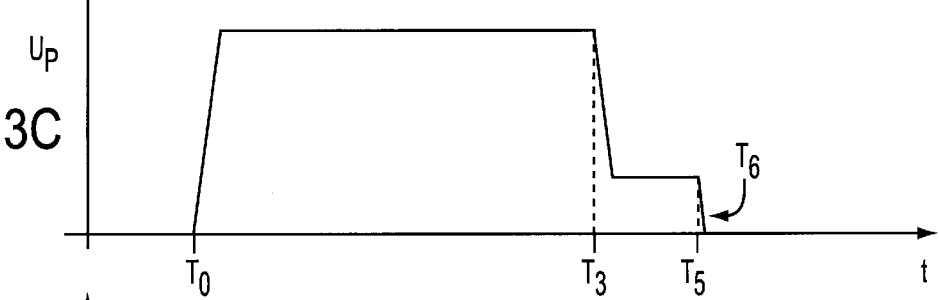
Figure 3D:
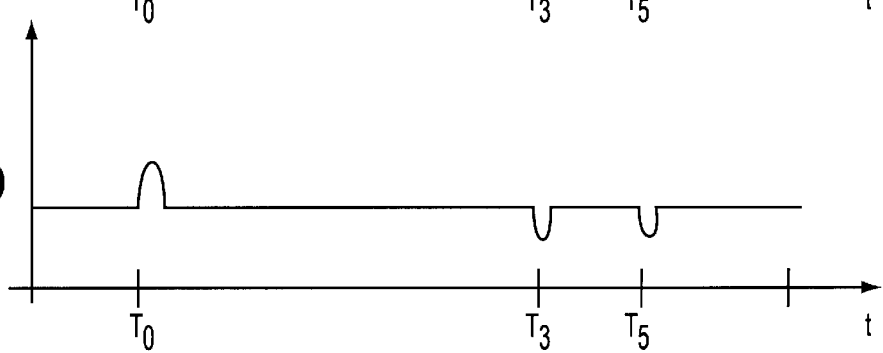

The switching arrangement shown in FIG. 2 for implementing the method according to the invention essentially consists of a same voltage source $U_B$, which is connected via a diode $D_v$ to the capacitor bank $C_1$ with much higher capacitance than the capacitive load of the actuator $C_P$. By closing a load switch $S_L$ and an inductance $L_1$, the actuator $C_P$ can be charged via the diode $D_E$.

Following the charging operation, the load switch $S_L$ is opened, as shown, and a discharge switch $S_E$ is closed, so that the discharging can occur via the inductance $L_1$ and a diode $D_L$ that is locked onto the capacitor bank $C_1$. As a result, the actuator $C_P$ charge for the capacitor bank $C_1$ can for the most part be reclaimed.

The residual charge remaining after the discharging operation as a result of the internal resistance of actuator $C_P$ is stored in the inductance $L_1$ by briefly closing a residual discharge switch $S_R$. Following the opening of the residual discharge switch $S_R$, the residual charge is fed back to the capacitor bank $C_1$ where it is stored. The advantage of this is that the capacitor bank $C_1$ must be recharged only with the low dissipation energies from the voltage source $U_B$. It makes sense if the direct voltage source $U_B$ and the capacitor bank $C_1$ are combined to form a controlled voltage source, wherein this voltage source is configured such, with respect to the regulation, that the respectively desired voltage can be adjusted to a respectively desirable value at the actuator $C_P$.

The above described charging and discharging operation is explained in further detail in the following, relative to dependence in time, and with the aid of the diagrams shown in FIGS. 3a–d.

In this case, the diagram 3a) shows the sequence and duration of the control pulses. The diagram 3b) shows the course over time of the voltage $U_C$ at the capacitor bank $C_1$, while the diagram 3c) shows the curve for the load voltage $U_P$. The diagram 3d) shows the load current curve.

A charging and discharging operation is explained with the aid of these diagrams. Prior to the start of the load control, meaning prior to the point in time $T_0$, the capacitor bank $C_1$ is charged to the voltage $U_B$ via the diode $D_V$. At point in time $T_0$, the load interrupter switch $S_L$ is closed. The reactance coil $L_1$ forms a series resonant circuit with the capacitive load $C_P$ via the freewheeling diode $D_E$. The charge is applied to the capacitive load. The voltage at the capacitor bank $C_1$ drops and the voltage at the load $C_P$ increases correspondingly. The current curve has a sine shape. The charging operation is completed following the time interval $t_1$. If the load circuit remains closed past this time interval, up to the point in time $T_2$, then this does not have an effect on the voltage at the load since the diode $D_E$ prevents a reversal of the current direction.

The load interrupter switch $S_L$ can be opened at any time, following completion of the charging operation. The point in time for opening is not critical in this case. If the load is to be discharged at point in time $T_3$, then the discharge switch $S_E$ is closed. The charge flows via the reactance coil $L_1$ and the freewheeling diode $D_L$ back into the capacitor bank $C_1$. The current curve in this series resonant circuit again has a sine shape. The voltage at load $C_P$ has dropped to the residual voltage $U_R$ during the time interval $t_4$. Actuating the discharge switch $S_E$ past this time interval does not result in a voltage reduction at the capacitive load. The voltage increase at the capacitor bank $C_1$ reflects the energy feedback.

In addition to the discharge switch $S_E$, the residual discharge switch $S_R$ is closed at point in time $T_5$. The reactance coil $L_1$ then forms a new series resonant circuit together with the capacitive load $C_P$. The residual energy stored in the capacitive load $C_P$ is thus stored in the reactance coil $L_1$. The voltage at the load $C_P$ has died down to 0 at point in time $T_6$. The discharging operation of load $C_P$ is thus completed. The current in the reactance coil $L_1$ is therefore at a maximum. The residual discharge switch $S_R$ must be opened at that moment. If the residual discharge switch $S_R$ remains closed, the freewheeling diode $D_P$ becomes conductive. The load voltage is clamped onto the forward voltage of the freewheeling diode $D_P$. This results in losses at the path resistance for diode $D_P$ and the ohmic resistances of the resonant circuit. The discharge switch $S_E$ thus must be opened, if possible, immediately after discharging the capacitive load $C_P$.

Following the opening of the residual load interrupter switch $S_R$ at point in time $T_6$, the current flow is maintained through reactance coil $L_1$, via the freewheeling diodes $D_L$ and $D_P$ and the discharge switch $S_E$ and onto the capacitor bank $C_1$. In this way, the residual energy previously stored in the load $C_P$ is released to the capacitor bank $C_1$. The voltage at capacitor bank $C_1$ increases again. At point in time $T_7$, the reactance coil $L_1$ is without energy. The feedback operation and thus the complete switching cycle are concluded. The point in time $T_8$ for opening the discharge switch $S_E$ is not critical. The capacitor bank $C_1$ is recharged from the source to the voltage $U_B$.

The diodes $D_L$ and $D_E$ can be omitted if the control for switches $S_L$ and $S_E$ are laid out in such a way that these are actuated at the correct point in time. The herein suggested solution with diodes $D_L$ and $D_E$ has the great advantage that these "select" practically by themselves the "correct" point in time for switching and an exact-time control of the discharge switch $S_E$ during the charging and the load switch $S_L$ during the discharging can be omitted.

What is claimed is:

1. A method for low-loss, periodic control of a capacitive load $C_P$ comprising the steps of:

prior to the start of load $C_P$ actuation, charging a capacitor bank $C_1$ to an operating voltage from a voltage source $U_B$;

charging the load $C_P$ with voltage from the capacitor bank $C_1$ via a resonant circuit formed by a reactance coil connected in series with a first freewheeling diode $D_E$ and the load $C_P$; and when voltage from load $C_P$ is required, connecting the load $C_P$ via a load switch $S_E$ to the reactance coil $L_1$ and then via a second freewheeling diode $D_L$ to the capacitor bank in order to discharge the voltage at load $C_P$, said second freewheeling diode $D_L$ being connected in series with the reactance coil $L_1$ and in parallel with the capacitor bank $C_1$.

2. The method according to claim 1, wherein the connecting step leaves a residual voltage $U_R$ at load $C_P$ and further comprising the step of briefly connecting the reactance coil $L_1$ to ground in order to reclaim the residual voltage $U_R$ from load $C_P$ to further discharge the voltage at load $C_P$.

3. The method according to claim 1, wherein the capacitance of the capacitor bank $C_1$ is higher than the capacitance of the load $C_P$.

4. The method according to claim 1, wherein the capacitive load $C_P$ is a piezoelectric actuator.

5. A circuit for low-loss, periodic control of a capacitive load $C_P$ comprising:

a capacitor bank $C_1$ connected in parallel with a voltage source $U_B$;

a resonant circuit connected in parallel with the capacitor bank $C_1$ and formed by a reactance coil $L_1$ connected in series with a first diode $D_E$ and the capacitive load $C_P$; and a discharge switch $S_E$ connected in parallel with said first diode $D_E$ and connected in a series with said reactance coil $L_1$ and said capacitive load $C_P$, wherein the capacitor bank $C_1$ is charged to an operating voltage from the voltage source $U_B$, the capacitive load $C_P$ is charged from the capacitor bank $C_1$ via the series resonant circuit when the discharge switch $S_E$ is open, and the capacitive load $C_P$ is discharged when the discharge switch $S_E$ is closed.

6. The circuit according to claim 5, where in the capacitive load $C_P$ is a piezoelectric actuator.

7. The circuit according to claim 5, further comprising a second diode $D_L$ connected between said capacitor bank $C_1$ and said reactance coil $L_1$, and a load switch $S_L$ connected in parallel with said second diode $D_L$, wherein when said discharge switch $S_E$ is closed and the load switch $S_L$ is open, the load $C_P$ is connected to the capacitor bank $C_1$ via the reactance coil $L_1$ and the second diode $D_L$ thereby discharging the capacitive load $C_P$, except for a residual voltaic $U_R$.

8. The circuit according to claim 7, wherein the first and second diodes are free-wheeling diodes.

9. The circuit according to claim 7, further comprising, a residual switch $S_R$ connected in parallel with said capacitor bank $C_1$, wherein the reactance load is briefly connected to a ground via a residual switch to order to discharge the residual $U_R$ from the load $C_P$.

10. The circuit according to claim 5, wherein the capacitor of capacitor bank $C_1$, is much higher than the capacitance of the load $C_P$.

11. The circuit according to claim 9, therein the capacitance of the capacitor bank $C_1$ is much higher than the capacitance of the load $C_P$.

* * * * *